(12) United States Patent
Radparvar et al.

(10) Patent No.: US 8,593,141 B1
(45) Date of Patent: Nov. 26, 2013

(54) MAGNETIC RESONANCE SYSTEM AND METHOD EMPLOYING A DIGITAL SQUID

(75) Inventors: Masoud Radparvar, Yorktown Heights, NY (US); Alan M. Kadin, Princeton Junction, NJ (US)

(73) Assignee: Hypres, Inc., Elmsford, NY (US)

( * ) Notice: Subject to any disclaimer, the term of this patent is extended or adjusted under 35 U.S.C. 154(b) by 365 days.

(21) Appl. No.: 12/954,291

(22) Filed: Nov. 24, 2010

Related U.S. Application Data

(60) Provisional application No. 61/264,032, filed on Nov. 24, 2009.

(51) Int. Cl.
*G01V 3/00* (2006.01)
*G01R 33/20* (2006.01)

(52) U.S. Cl.
USPC ............ 324/307; 324/309; 324/322; 324/248

(58) Field of Classification Search
USPC ................. 324/300–322, 248; 600/407–464
See application file for complete search history.

(56) References Cited

U.S. PATENT DOCUMENTS

| | | | | |
|---|---|---|---|---|
| 5,045,788 A | * | 9/1991 | Hayashi et al. | 324/248 |
| 5,355,085 A | * | 10/1994 | Igarashi et al. | 324/248 |
| 5,885,215 A | * | 3/1999 | Dossel et al. | 600/409 |
| 7,248,044 B2 | * | 7/2007 | Kobayashi et al. | 324/248 |
| 7,598,897 B2 | * | 10/2009 | Kirichenko | 341/172 |
| 7,953,174 B2 | | 5/2011 | Asbeck et al. | |
| 8,008,914 B2 | * | 8/2011 | Penanen et al. | 324/300 |
| 2003/0016010 A1 | * | 1/2003 | Kandori et al. | 324/248 |

* cited by examiner

*Primary Examiner* — Jermele M Hollington
*Assistant Examiner* — Emily Chan
(74) *Attorney, Agent, or Firm* — Steven M. Hoffberg; Ostrolenk Faber LLP

(57) ABSTRACT

A magnetic resonance system, comprising at least one SQUID, configured to receive a radio frequency electromagnetic signal, in a circuit configured to produce a pulsatile output having a minimum pulse frequency of at least 1 GHz which is analyzed in a processor with respect to a timebase, to generate a digital signal representing magnetic resonance information. The processor may comprise at least one rapid single flux quantum circuit. The magnetic resonance information may be image information. A plurality of SQUIDs may be provided, fed by a plurality of antennas in a spatial array, to provide parallel data acquisition. A broadband excitation may be provided to address a range of voxels per excitation cycle. The processor may digitally compensate for magnetic field inhomogeneities.

20 Claims, 7 Drawing Sheets

MAGNETIC RESONANCE SYSTEM AND METHOD EMPLOYING A DIGITAL SQUID

CROSS REFERENCE TO RELATED APPLICATIONS

The present application claims benefit of priority from U.S. Provisional Patent Application Ser. No. 61/264,032, filed Nov. 24, 2009, the entirety of which is expressly incorporated herein by reference.

BACKGROUND OF THE INVENTION

Magnetic resonance imaging (MRI) is an established technology for high resolution three-dimensional imaging of the living human body, without the need for potentially hazardous x-rays. See, Joseph P. Hornak, Ph.D., The Basics of MRI, [[http://]]www.cis.rit.edu/htbooks/mri/ (copyright 1996-2010), expressly incorporated herein by reference. This is based on magnetic resonance of the magnetic moments of hydrogen nuclei (protons) in the presence of a magnetic field. The process involves resonant absorption and emission of a radio-frequency (RF) signal in the tissue, at a frequency given by $f=\gamma B$, where B is the field in teslas (T) and $\gamma=43$ MHz/T for the proton. Since the signal strength and the spatial resolution generally increase with larger fields, conventional MRI technology typically uses a field of at least B=1.5 T, corresponding to f=65 MHz. A uniform, low-noise magnetic field of this magnitude requires a superconducting magnet, which yields a large and bulky system.

MRI is sensitive to the magnetic field gradient, temperature, and microenvironment. By using a strong, uniform field, many relatively weak contributing factors are generally ignored in the analysis. However, using powerful computing devices, it is possible to analyze each voxel (minimum unit of volume in the image space) dependent on its particular magnetic field strength, gradient, and therefore draw conclusions about its microenvironment and structure, which is the typical goal of an MRI procedure.

One disadvantage of this conventional method is that it can be quite slow to achieve high resolution imaging over a substantial volume of tissue. An imaging time of many minutes can be inconvenient for the patient, as well as being inconsistent with moving tissues such as the heart and lungs. Functional MRI (fMRI) acquires a series of MRI images which are time-synchronized with a physiological status, i.e., heartbeat, to permit imaging of moving tissues, and perhaps more importantly, an analysis of their dynamic attributes.

The slow imaging time is limited by scanning magnetic field gradients in three dimensions to select a small region corresponding to the resonance condition. A single receiver coil typically measures this RF signal. One approach to accelerating the image acquisition is to use a plurality of receiver coils, with different locations, in order to obtain some spatial information and reduce the need for the full gradient scanning. A fully parallel approach which can eliminate entirely at least one dimension of gradient scanning is sometimes called "single echo acquisition", and comprises using an array of N closed spaced (but decoupled) receiver coils, where N=64 coils has been demonstrated. (See, for example, U.S. Pat. No. 6,771,071, "Magnetic resonance imaging using a reduced number of echo acquisitions", expressly incorporated herein by reference.) While this does increase the image acquisition speed, this approach has not yet been adopted for commercial MRI systems, due in part to the complex network of RF receivers required.

A recently developed alternative technology for MRI uses ultra-low magnetic fields, with measurement fields as low as the microtesla range, and frequencies as low as 1 kHz instead of 65 MHz. See, for example, U.S. Pat. Nos. 6,159,444; 6,885,192; 7,053,410; 7,117,102; 7,218,104; 7,187,169; and published US patent application 2009/0072828, expressly incorporated herein by reference.

This runs counter to the conventional trend of using ever higher magnetic fields to improve signal integrity and resolution. However, this approach can make use of ultra-sensitive magnetic field detectors called superconducting quantum interference devices, or SQUIDs. The sensitivity of the SQUID detector can partially compensate for the weak signal at these very low frequencies. A system of this type does not address the imaging speed issue (which may even be slower due to additional required signal averaging), but such a system would be substantially more compact and portable due to the small magnetic field, and therefore likely small magnet. Still, work to date has demonstrated only a fairly low-resolution system, which would limit its applicability.

One suggested improvement on the ultra-low field MRI system, to increase the signal-to-noise ratio and the resolution, is to use a plurality of SQUID receivers. This would also enable the same system to be used for magnetoencephalography (MEG) or magnetocardiography (MCG), where the array of SQUIDs could also localize sources of electrical currents in nerves or heart muscle. (See, for example, U.S. Pat. No. 7,573,268, "Direct imaging of neural currents using ultralow field magnetic resonance techniques", expressly incorporated herein by reference, and V. Zotev et al, "Parallel MRI at Microtesla Fields", J. Magnetic Resonance, vol. 192, p. 197, 2008.) However, this partially parallel approach did not address how this small array (with 7 elements) could be scaled to much larger numbers to achieve large scan-time acceleration factors.

It is well known in the art that SQUIDs are capable of ultra-sensitive measurements of magnetic fields at low frequencies of order a kilohertz or less. However, it is less well known that the SQUID itself is actually a high-frequency device, capable of field measurement up to GHz frequencies. The frequency limitation in conventional SQUID systems is actually in the external control loop that extends the dynamic range and linearity of the device as an analog sensor of magnetic field strength and/or gradient. Two complementary approaches have been developed to adapt SQUIDs to practical RF systems. In one approach, arrays of SQUIDs (sometimes called superconducting quantum interference filters or SQIFs) are coupled together to increase linearity and dynamic range, without requiring an external control loop. (See, for example, U.S. Pat. Nos. 6,690,162 and 7,369,093, expressly incorporated herein by reference.) In another approach, sometimes called a digital SQUID or a SQUID-based digitizer, the SQUID is used to generate fast single-flux-quantum (SFQ) voltage pulses, which are processed by rapid-single-flux-quantum (RSFQ) superconducting digital logic circuits to achieve a combination of linearity and dynamic range, as well as the flexibility of digital processing. See, for example, U.S. Pat. Nos. 5,420,586; 7,365,663; 7,598, 897, expressly incorporated herein by reference.

The present technology provides improvements for an MRI system that may help achieve the dual goals of fine imaging, while also obtaining substantial acceleration of image acquisition. Likewise, the present technology may also assist in reducing the system bulk, and enhancing flexibility.

A useful background of MRI is found in [http://]en.wikipedia.org/wiki/Magnetic_resonance_imaging (Nov. 22, 2009), expressly incorporated herein by reference. In order to acquire a Magnetic Resonance Image, Radio frequency (RF) fields are used to periodically align a magnetic moment of a portion of hydrogen (or certain other atomic isotopes), which then relax to their unaligned state over time. Certain nuclei such as $^1$H (protons), $^2$H, $^3$He, $^{13}$C, $^{23}$Na or $^{31}$P, have a non-zero spin and therefore a magnetic moment. In the case of the so-called spin-½ nuclei, such as $^1$H, there are two spin states, sometimes referred to as "up" and "down". When these spins are placed in a strong external magnetic field they precess around an axis along the direction of the field. Protons align in two energy "eigenstates" (the "Zeeman effect"): one low-energy and one high-energy, which are separated by a very small splitting energy.

An image may be made, on a per-voxel basis, of the magnitude and relaxation time of the magnetic alignment. The frequency at which the protons resonate depends on the strength of the magnetic field. This field-strength dependence therefore allows a frequency encoding of position. By superposing fields which predictably alter the magnetic field in known manner, different coordinates may be "addressed", allowing full image formation, for example as a set of slices, or as a three dimensional matrix.

Different tissues can be distinguished because different chemicals, prototypically water and lipid, can be detected because the protons in different chemical compositions return to their equilibrium state at different rates. There are other aspects of magnetic resonance that can also be exploited to extract information. For example, in addition to relaxation time, local environments can also create perturbation of magnetic fields, and the presence of characteristic perturbations can be used to infer the local environment. For example, a single proton can predictably perturb the magnetic field of another proton located proximately on the same molecule.

In the static magnetic fields commonly used in MRI, the energy difference between the nuclear spin states corresponds to a radio frequency photon. Resonant absorption of energy by the protons due to an external oscillating magnetic field will occur at the Larmor frequency for the particular nucleus.

The net magnetization vector has two states. The longitudinal magnetization is due to a tiny excess of protons in the lower energy state. This gives a net polarization parallel to the external field. Application of an RF pulse can tip sideways (with i.e. a so-called 90° pulse) or even reverse (with a so-called 180° pulse) this net polarization vector.

The recovery of longitudinal magnetization is called longitudinal or $T_1$ relaxation and occurs exponentially with a time constant $T_1$. The loss of phase coherence in the transverse plane is called transverse or $T_2$ relaxation. $T_1$ is thus associated with the enthalpy of the spin system (the number of nuclei with parallel versus anti-parallel spin) while $T_2$ is associated with its entropy (the number of nuclei in phase).

When the radio frequency pulse is turned off, the transverse vector component produces an oscillating magnetic field which induces a small current in the receiver coil. This signal is called the free induction decay (FID). In an idealized nuclear magnetic resonance experiment, the FID decays approximately exponentially with a time constant $T_2$, but in practical MRI small differences in the static magnetic field at different spatial locations ("inhomogeneities") cause the Larmor frequency to vary across the body creating destructive interference which shortens the FID. The time constant for the observed decay of the FID is called the $T_2^*$ relaxation time, and is always shorter than $T_2$. Also, when the radio frequency pulse is turned off, the longitudinal magnetization starts to recover exponentially with a time constant $T_1$.

In MRI, the static magnetic field is caused to vary across the body (a field gradient), so that different spatial locations become associated with different precession frequencies. Usually these field gradients are pulsed, and a variety of RF and gradient pulse sequences may be used. Application of field gradient destroys the FID signal, but this can be recovered and measured by a refocusing gradient (to create a so-called "gradient echo"), or by a radio frequency pulse (to create a so-called "spin-echo"). The whole process can be repeated when some $T_1$-relaxation has occurred and the thermal equilibrium of the spins has been more or less restored.

Typically in soft tissues $T_1$ is around one second while $T_2$ and $T_2^*$ are a few tens of milliseconds, but these values vary widely between different tissues (and different external magnetic fields), permitting MRI distinguish different types of soft tissues. Contrast agents work by altering (shortening) the relaxation parameters, especially $T_1$.

A number of schemes have been devised for combining field gradients and radio frequency excitation to create an image: 2D or 3D reconstruction from projections, much as in Computed Tomography; Building the image point-by-point or line-by-line; Gradients in the RF field rather than the static field. Although each of these schemes is occasionally used in specialist applications, the majority of MR Images today are created either by the Two-Dimensional Fourier Transform (2DFT) technique with slice selection, or by the Three-Dimensional Fourier Transform (3DFT) technique. Another name for 2DFT is spin-warp. The 3DFT technique is rather similar except that there is no slice selection and phase-encoding is performed in two separate directions. Another scheme which is sometimes used, especially in brain scanning or where images are needed very rapidly (such as in functional MRI or fMRI), is called echo-planar imaging (EPI): In this case, each RF excitation is followed by a train of gradient echoes with different spatial encoding.

Image contrast is created by differences in the strength of the NMR signal recovered from different locations within the sample. This depends upon the relative density of excited nuclei (usually water protons), on differences in relaxation times ($T_1$, $T_2$, and $T_2^*$) of those nuclei after the pulse sequence, and often on other parameters. Contrast in most MR images is actually a mixture of all these effects, but careful design of the imaging pulse sequence allows one contrast mechanism to be emphasized while the others are minimized. In the brain, $T_1$-weighting causes the nerve connections of white matter to appear white, and the congregations of neurons of gray matter to appear gray, while cerebrospinal fluid (CSF) appears dark. The contrast of white matter, gray matter and cerebrospinal fluid is reversed using $T_2$ or $T_2^*$ imaging, whereas proton-density-weighted imaging provides little contrast in healthy subjects. Additionally, functional parameters such as cerebral blood flow (CBF), cerebral blood volume (CBV) or blood oxygenation can affect $T_1$, $T_2$ and $T_2^*$ and so can be encoded with suitable pulse sequences.

In some situations it is not possible to generate enough image contrast to adequately show the anatomy or pathology of interest by adjusting the imaging parameters alone, in which case a contrast agent may be administered. This can be as simple as water, taken orally, for imaging the stomach and small bowel. However, most contrast agents used in MRI are selected for their specific magnetic properties. Most commonly, a paramagnetic contrast agent (usually a gadolinium compound) is given. Gadolinium-enhanced tissues and fluids appear extremely bright on $T_1$-weighted images. This provides high sensitivity for detection of vascular tissues (e.g., tumors) and permits assessment of brain perfusion (e.g., in stroke).

More recently, superparamagnetic contrast agents, e.g., iron oxide nanoparticles, have become available. These agents appear very dark on $T_2$-weighted images and may be used for liver imaging, as normal liver tissue retains the agent, but abnormal areas (e.g., scars, tumors) do not. They can also be taken orally, to improve visualization of the gastrointestinal tract, and to prevent water in the gastrointestinal tract from obscuring other organs (e.g., the pancreas). Diamagnetic agents such as barium sulfate have also been studied for potential use in the gastrointestinal tract, but are less frequently used.

In 1983 Ljunggren and Tweig independently introduced the k-space formalism, a technique that proved invaluable in unifying different MR imaging techniques. They showed that the demodulated MR signal S(t) generated by freely precessing nuclear spins in the presence of a linear magnetic field gradient G equals the Fourier transform of the effective spin density. Mathematically:

$$S(t) = \tilde{\rho}_{\text{eff}}(\vec{k}(t)) = \int d\vec{x}\, \rho(\vec{x}) \cdot e^{2\pi i \vec{k}(t) \cdot \vec{x}}$$

where:

$$\vec{k}(t) \equiv \int_0^t \vec{G}(\tau) d\tau$$

In other words, as time progresses the signal traces out a trajectory in k-space with the velocity vector of the trajectory proportional to the vector of the applied magnetic field gradient. By the term effective spin density we mean the true spin density $\rho(\vec{x})$ corrected for the effects of $T_1$ preparation, $T_2$ decay, dephasing due to field inhomogeneity, flow, diffusion, etc., and any other phenomena that affect that amount of transverse magnetization available to induce signal in the RF probe. From the basic k-space formula, it follows immediately that an image $I(\vec{x})$ may be constructed by taking the inverse Fourier transform of the sampled data:

$$I(\vec{x}) = \int d\vec{x}\, S(\vec{k}(t)) \cdot e^{-2\pi i \vec{k}(t) \cdot \vec{x}}$$

In a standard spin echo or gradient echo scan, where the readout (or view) gradient is constant (e.g. G), a single line of k-space is scanned per RF excitation. When the phase encoding gradient is zero, the line scanned is the $k_x$ axis. When a non-zero phase-encoding pulse is added in between the RF excitation and the commencement of the readout gradient, this line moves up or down in k-space, i.e., we scan the line $k_y$=constant. In single-shot EPI, all of k-space is scanned in a single shot, following either a sinusoidal or zig-zag trajectory. Since alternating lines of k-space are scanned in opposite directions, this must be taken into account in the reconstruction. Multi-shot EPI and fast spin echo techniques acquire only part of k-space per excitation. In each shot, a different interleaved segment is acquired, and the shots are repeated until k-space is sufficiently well-covered. Since the data at the center of k-space represent lower spatial frequencies than the data at the edges of k-space, the $T_E$ value for the center of k-space determines the image's $T_2$ contrast.

The importance of the center of k-space in determining image contrast can be exploited in more advanced imaging techniques. One such technique is spiral acquisition—a rotating magnetic field gradient is applied, causing the trajectory in k-space to spiral out from the center to the edge. Due to $T_2$ and $T_2^*$ decay the signal is greatest at the start of the acquisition, hence acquiring the center of k-space first improves contrast to noise ratio (CNR) when compared to conventional zig-zag acquisitions, especially in the presence of rapid movement.

Since $\vec{x}$ and $\vec{k}$ are conjugate variables (with respect to the Fourier transform) we can use the Nyquist theorem to show that the step in k-space determines the field of view of the image (maximum frequency that is correctly sampled) and the maximum value of k sampled determines the resolution for each axis, i.e., $$FOV \propto \frac{1}{\Delta k} \quad \text{Resolution} \propto |k_{max}|.$$

In acquiring a typical MRI image, Radio frequencies are transmitted at the Larmor frequency of the nuclide to be imaged. For example, for $^1$H in a magnetic field of 1 T, a frequency of 42.5781 MHz would be employed. During the first part of the pulse sequence, a shaped pulse, e.g., using sinc modulation, causes a 90° nutation of longitudinal nuclear magnetization within a slab, or slice, creating transverse magnetization. During the second part of the pulse sequence, a phase shift is imparted upon the slice-selected nuclear magnetization, varying with its location in the Y direction. During the third part of the pulse sequence, another slice selection (of the same slice) uses another shaped pulse to cause a 180° rotation of transverse nuclear magnetization within the slice. This transverse magnetization refocuses to form a spin echo at a time TE. During the spin echo, a frequency-encoding (FE) or readout gradient is applied, making the resonant frequency of the nuclear magnetization vary with its location in the X direction. The signal is sampled $n_{FE}$ times by the ADC during this period. Typically $n_{FE}$ of between 128 and 512 samples are taken. The longitudinal magnetization is then allowed to recover somewhat and after a time TR the whole sequence is repeated $n_{PE}$ times, but with the phase-encoding gradient incremented. Typically $n_{PE}$ of between 128 and 512 repetitions are made. Negative-going lobes in $G_X$ and $G_Z$ are imposed to ensure that, at time TE (the spin echo maximum), phase only encodes spatial location in the Y direction. Typically TE is between 5 ms and 100 ms, while TR is between 100 ms and 2000 ms.

After the two-dimensional matrix (typical dimension between 128×128 and 512×512) has been acquired, producing the so-called K-space data, a two-dimensional Fourier transform is performed to provide the familiar MR image. Either the magnitude or phase of the Fourier transform can be taken, the former being far more common.

The magnet is a large and expensive component of an MRI scanner. The strength of the magnet is measured in tesla (T). Clinical magnets generally have a field strength in the range 0.1-3.0 T, with research systems available up to 9.4 T for human use and 21 T for animal systems. Just as important as the strength of the main magnet is its precision. The straightness of the magnetic lines within the center (or, as it is technically known, the iso-center) of the magnet needs to be near-perfect. This is known as homogeneity. Fluctuations (inhomogeneities in the field strength) within the scan region should be less than three parts per million (3 ppm). Three types of magnets have been used:

Permanent magnet: Conventional magnets made from ferromagnetic materials (e.g., iron alloys or compounds containing rare earth elements such as neodymium) can be used to provide the static magnetic field. A permanent magnet that is powerful enough to be used in a traditional type of MRI will be extremely large and bulky; they can weigh over 100 tons. Permanent magnet MRIs are very inexpensive to maintain; this cannot be said of the other types of MRI magnets, but there are significant drawbacks to using permanent magnets. They are only capable of achieving weak field strengths compared to other MRI magnets (usually less than 0.4 T) and they are of limited precision and stability. Permanent magnets also present special safety issues; since their magnetic fields cannot be "turned off," ferromagnetic objects are virtually impossible to remove from them once they come into direct contact. Permanent magnets also require special care when they are being brought to their site of installation.

Resistive electromagnet: A solenoid wound from copper wire is an alternative to a permanent magnet. An advantage is low initial cost, but field strength and stability are limited. The electromagnet requires considerable electrical energy during operation which can make it expensive to operate. This design is considered obsolete for typical application.

Superconducting electromagnet: When a niobium-titanium or niobium-tin alloy is cooled by liquid helium to 4 K (−269° C., −452° F.) it becomes a superconductor, losing resistance to flow of electrical current. An electromagnet constructed with superconductors can have extremely high field strengths, with very high stability. The construction of such magnets is costly, and the cryogenic helium imposes operating costs and requires careful handling. However, despite their cost, helium cooled superconducting magnets are the most common type found in MRI scanners today.

Magnetic field strength is an important factor in determining image quality. Higher magnetic fields increase signal-to-noise ratio, permitting higher resolution or faster scanning. However, higher field strengths require more costly magnets with higher maintenance costs, and have increased safety concerns. A field strength of 1.0-1.5 T is considered a good compromise between cost and performance for general medical use. However, for certain specialist uses (e.g., brain imaging) higher field strengths are desirable, with some hospitals now using 3.0 T scanners.

Gradient coils are used to spatially encode the positions of protons by varying the magnetic field linearly across the imaging volume. The Larmor frequency will then vary as a function of position in the x, y and z-axes. Gradient coils are usually resistive electromagnets powered which permit rapid and precise adjustments to their field strength and direction. Typical gradient systems are capable of producing gradients from 20 mT/m to 100 mT/m (i.e., in a 1.5 T magnet, when a maximal Z-axis gradient is applied, the field strength may be 1.45 T at one end of a 1 m long bore and 1.55 T at the other). It is the magnetic gradients that determine the plane of imaging—because the orthogonal gradients can be combined freely, any plane can be selected for imaging. Scan speed is typically dependent on performance of the gradient system. Stronger gradients allow for faster imaging, or for higher resolution; similarly, gradients systems capable of faster switching can also permit faster scanning. However, gradient performance may also be limited by safety concerns over possible nerve stimulation.

The radio frequency (RF) transmission system consists of an RF synthesizer, power amplifier and transmitting coil. The receiver in a traditional system consists of a receiving coil, pre-amplifier and signal processing system. It is possible to scan using an integrated coil for RF transmission and MR signal reception, but if a small region is being imaged, then better image quality (i.e. higher signal-to-noise ratio) is obtained by using a close-fitting smaller coil.

A recent development in MRI technology has been the development of sophisticated multi-element phased array coils which are capable of acquiring multiple channels of data in parallel. See, Roemer P B, Edelstein W A, Hayes C E, Souza S P, Mueller O M (1990). "The NMR phased array". *Magnetic Resonance in Medicine* 16 (2): 192-225. This 'parallel imaging' technique uses acquisition schemes that allow for accelerated imaging, by replacing some of the spatial coding originating from the magnetic gradients with the spatial sensitivity of the different coil elements. However, the increased acceleration also reduces the signal-to-noise ratio and can create residual artifacts in the image reconstruction. Two frequently used parallel acquisition and reconstruction schemes are known as SENSE and GRAPPA. See, Pruessmann K P, Weiger M, Scheidegger M B, Boesiger P (1999). "SENSE: Sensitivity encoding for fast MRI". Magnetic Resonance in Medicine 42 (5): 952-962. doi:10.1002/(SICI) 1522-2594(199911)42:5<952::AID-MRM16>3.0.00; 2-S. PMID 10542355, Griswold M A, Jakob P M, Heidemann R M, Nittka M, Jellus V, Wang J, Kiefer B, Haase A (2002). "Generalized autocalibrating partially parallel acquisitions (GRAPPA)". Magnetic Resonance in Medicine 47 (6): 1202-1210.

doi:10.1002/mrm.10171. PMID 12111967; Blaimer M, Breuer F, Mueller M, Heidemann R M, Griswold M A, Jakob P M (2004). "SMASH, SENSE, PILS, GRAPPA: How to Choose the Optimal Method". Topics in Magnetic Resonance Imaging 15 (4): 223-236. [http://]cfmriweb.ucsd.edu/ttliu/ be280a_05/blaimer05.pdf.

Hydrogen is the most frequently imaged nucleus in MRI because it is present in biological tissues in great abundance. However, any nucleus which has a net nuclear spin could potentially be imaged with MRI. Such nuclei include helium-3, carbon-13, fluorine-19, oxygen-17, sodium-23, phosphorus-31 and xenon-129. $^{23}$Na and $^{31}$P are naturally abundant in the body, so can be imaged directly. Gaseous isotopes such as $^{3}$He or $^{129}$Xe must be hyperpolarized and then inhaled as their nuclear density is too low to yield a useful signal under normal conditions. $^{17}$O, $^{13}$C and $^{19}$F can be administered in sufficient quantities in liquid form (e.g. $^{17}$O-water, $^{13}$C-glucose solutions or perfluorocarbons) that hyperpolarization is not a necessity.

Multinuclear imaging is primarily a research technique at present. However, potential applications include functional imaging and imaging of organs poorly seen on $^1$H MRI (e.g. lungs and bones) or as alternative contrast agents. Inhaled hyperpolarized $^3$He can be used to image the distribution of air spaces within the lungs. Injectable solutions containing $^{13}$C or stabilized bubbles of hyperpolarized $^{129}$Xe have been studied as contrast agents for angiography and perfusion imaging. $^{31}$P can potentially provide information on bone density and structure, as well as functional imaging of the brain.

Portable magnetic resonance instruments are available for use in education and field research. Using the principles of Earth's field NMR, they have no powerful polarizing magnet, so that such instruments can be small and inexpensive. Some can be used for both EFNMR spectroscopy and MRI imaging, e.g., the Terranova-MRI Earth's Field MRI teaching system ([http://]www.magritek.com/terranova.html). The low strength of the Earth's field results in poor signal to noise ratios, requiring long scan times to capture spectroscopic data or build up MRI images.

A magnetic resonance system that can flexibly combine a plurality of signals and antennas, permitting faster generation of high-resolution medical images in a safe and economical system, is desirable.

REFERENCES (each of which is expressly incorporated herein by reference)

Lauterbur P C (1973). "Image Formation by Induced Local Interactions: Examples of Employing Nuclear Magnetic Resonance". *Nature* 242: 190-191. doi:10.1038/ 242190a0.

Lauterbur P C (1974). "Magnetic resonance zeugmatography". *Pure and Applied Chemistry* 40: 149-157. doi: 10.1351/pac197440010149.

Callaghan P (1994). *Principles of Nuclear Magnetic Resonance Microscopy*. Oxford University Press. ISBN 0198539975.

Ljunggren S (1983). "A simple graphical representation of Fourier-based imaging methods". *Journal of Magnetic Resonance* 54 (2): 338-343. doi:10.1016/0022-2364(83) 90060-4.

Twieg D (1983). "The k-trajectory formulation of the NMR imaging process with applications in analysis and synthesis of imaging methods". *Medical Physics* 10 (5): 610-621. doi:10.1118/1.595331. PMID 6646065.

Chen C N, Hoult D H (1989). *Biomedical Magnetic Resonance Technology*. Medical Sciences. Taylor & Francis. ISBN 978-0852741184.

Oppelt A (2006). *Imaging Systems for Medical Diagnostics: Fundamentals, Technical Solutions and Applications for Systems Applying Ionizing Radiation, Nuclear Magnetic Resonance and Ultrasound*. Wiley-VCH. p. 566. ISBN 978-3895782268.

Roemer P B, Edelstein W A, Hayes C E, Souza S P, Mueller O M (1990). "The NMR phased array". *Magnetic Resonance in Medicine* 16 (2): 192-225. doi:10.1002/mrm.1910160203. PMID 2266841.

Pruessmann K P, Weiger M, Scheidegger M B, Boesiger P (1999). "SENSE: Sensitivity encoding for fast MRI". *Magnetic Resonance in Medicine* 42 (5): 952-962. doi:10.1002/(SICI)1522-2594(199911)42:5<952::AID-MRM16>3.0.00; 2-S. PMID 10542355.

Griswold M A, Jakob P M, Heidemann R M, Nittka M, Jellus V, Wang J, Kiefer B, Haase A (2002). "Generalized autocalibrating partially parallel acquisitions (GRAPPA)". *Magnetic Resonance in Medicine* 47 (6): 1202-1210. doi: 10.1002/mrm.10171. PMID 12111967.

Blaimer M, Breuer F, Mueller M, Heidemann R M, Griswold M A, Jakob P M (2004). "SMASH, SENSE, PILS, GRAPPA: How to Choose the Optimal Method". *Topics in Magnetic Resonance Imaging* 15 (4): 223-236. [http://]cfmriweb.ucsd.edu/ttliu/be280a_05/blaimer05.pdf.

Le Bihan D, Breton E, Lallemand D, Grenier P, Cabanis E, Laval-Jeantet M. (November 1986). "MR imaging of intravoxel incoherent motions: Application to diffusion and perfusion in neurologic disorders.". *Radiology*. 161 (2): 401-7. PMID 3763909.

Moseley M E, Cohen Y, Mintorovitch J, Chileuitt L, Shimizu H, Kucharczyk J, Wendland M F, Weinstein P R. (1990). "Early detection of regional cerebral ischemia in cats: Comparison of diffusion- and T$_2$-weighted MRI and spectroscopy". *Magn Reson Med* 14 (2): 330-46. doi:10.1002/mrm.1910140218. PMID 2345513.

De Coene B, Hajnal J V, Gatehouse P, Longmore D B, White S J, Oatridge A, Pennock J M, Young I R, Bydder G M. (November 1992). "MR of the brain using fluid-attenuated inversion recovery (FLAIR) pulse sequences". *Am J Neuroradiol* 13 (6): 1555-64. PMID 1332459.

Ridgway J P, Smith M A (June 1986). "A technique for velocity imaging using magnetic resonance imaging". *Br J Radiol* 59 (702): 603-7. doi:10.1259/0007-1285-59-702-603. PMID 3708269.

Njemanze P C, Beck O J (1989). "MR-gated intracranial CSF dynamics: Evaluation of CSF pulsatile flow". *AJNR Am J Neuroradiol* 10 (1): 77-80. PMID 2492733.

Rosen Y, Lenkinski R E (2007). "Recent advances in magnetic resonance neurospectroscopy.". *Neurotherapeutics* 27 (3): 330-45. doi:10.1016/j.nurt.2007.04.009. PMID 17599700.

Golder W (2007). "Magnetic resonance spectroscopy in clinical oncology.". *Onkologie* 27 (3): 304-9. doi:10.1159/000077983. PMID 15249722.

Thulborn K R, Waterton J C, Matthews P M, Radda G K (February 1982). "Oxygenation dependence of the transverse relaxation time of water protons in whole blood at high field". *Biochim. Biophys. Acta* 714 (2): 265-70. PMID 6275909. [http://]linkinghub.elsevier.com/retrieve/pii/0304-4165(82)90333-6.

Original paper available at [http://]radiology.rsna.org/content/204/1/272.long

[http://]www.mrimaging.com

Wattjes M P, Lutterbey G G, Gieseke J, et al. (1 Jan. 2007). "Double inversion recovery brain imaging at 3 T: Diagnostic value in the detection of multiple sclerosis lesions." *AJNR Am J Neuroradiol* 28 (1): 54-9. PMID 17213424. [http://]www.ajnr.org/cgi/pmidlookup?view=long&pmid=17213424.

Nelson F, Poonawalla A H, Hou P, Huang F, Wolinsky J S, Narayana P A (October 2007). "Improved identification of intracortical lesions in multiple sclerosis with phase-sensitive inversion recovery in combination with fast double inversion recovery MR imaging". *AJNR Am J Neuroradiol* 28 (9): 1645-9. doi:10.3174/ajnr.A0645. PMID 17885241.

Nelson F, Poonawalla A, Hou P, Wolinsky J S, Narayana P A (November 2008). "3D MPRAGE improves classification of cortical lesions in multiple sclerosis". *Mult Scler.* 14 (9): 1214-9. doi:10.1177/1352458508094644. PMID 18952832.

Brant-Zawadzki M, Gillan G D, Nitz W R (March 1992). "MP RAGE: A three-dimensional, T$_1$-weighted, gradient-echo sequence—initial experience in the brain". *Radiology* 182 (3): 769-75. PMID 1535892. [http://]radiology.rsnajnls.org/cgi/pmidlookup?view=long&pmid=1535892.

I. M. Savukov and M. V. Romalis (2005). "MNR Detection with an Atomic Magnetometer" (PDF). *Physical Review Letters* 94. [http://]www.atomic.princeton.edu/romalis/magnetometer/papers/Savukov%20and%20Romalis%20-%20NMR%20Detection%20with%20an%20Atomic%20Magnetometer.pdf.

Blog comment: "Hi-res, cheap & portable MRI". Neurophilosophy (blog). [http://]neurophilosophy.wordpress.com/2006/09/06/hi-res-cheap-portable-mri/.

Raftery D (August 2006). "MRI without the magnet". *Proc Natl Acad Sci USA.* 103 (34): 12657-8. doi:10.1073/pnas.0605625103. PMID 16912110.

Wu Y, Chesler D A, Glimcher M J, et al. (February 1999). "Multinuclear solid-state three-dimensional MRI of bone and synthetic calcium phosphates". *Proc. Natl. Acad. Sci. U.S.A.* 96 (4): 1574-8. doi:10.1073/pnas.96.4.1574. PMID 9990066. PMC 15521. [http://]www.pnas.org/cgi/pmidlookup?view=long&pmid=9990066.

Simon, Merrill; Mattson, James S (1996). *The pioneers of NMR and magnetic resonance in medicine: The story of MRI*. Ramat Gan, Israel: Bar-Ilan University Press. ISBN 0-9619243-1-4.

Haacke, E Mark; Brown, Robert F; Thompson, Michael; Venkatesan, Ramesh (1999). *Magnetic resonance imaging: Physical principles and sequence design*. New York: J. Wiley & Sons. ISBN 0-471-35128-8.

Joseph P. Hornak, Ph.D. The Basics of MRI. *Underlying physics and technical aspects*. [[http://]]www.cis.rit.edu/htbooks/mri/ (copyright 1996-2010).

Alfred L. Horowitz, MRI physics for radiologists: a visual approach, 3d ed. Springer, 1995, ISBN 0387943722, 9780387943725.

Ephraim Feig, Advances in magnetic resonance imaging, Volume 1, Intellect Books, 1989, ISBN 0893914452, 9780893914455

Sunder S. Rajan, MRI: a conceptual overview, Springer, 1998, ISBN 0387949119, 9780387949116

Catherine Westbrook, Carolyn Kaut, MRI in practice, 2d ed., Wiley-Blackwell, 1998, ISBN 0632042052, 9780632042050.

Paul T. Callaghan, Principles of nuclear magnetic resonance microscopy, Oxford University Press, 1993, ISBN 0198539975, 9780198539971

Dominik Weishaupt, Victor D. Köchli, Borut Marincek, How does MRI work?: an introduction to the physics and function of magnetic resonance imaging, Springer, 2003, ISBN 3540440941, 9783540440949

Marinus T. Vlaardingerbroek, Jacques A. den Boer, Magnetic resonance imaging: theory and practice, Physics and astronomy online library, 3d ed., Springer, 2003, ISBN 3540436812, 9783540436812.

Dimitris Mitsouras, Frank J. Rybicki, Alan Edelman, Gary P. Zientara, "Fast Magnetic Resonance Imaging via Adaptive Broadband Encoding of the MR Signal Content", Magnetic Resonance Imaging, 24; 1209-1227, 2006.

Dimitris Mitsouras, Sc.D. Dissertation: "A Numerical Approach: Broadband Technologies for Efficient Magnetic Resonance Imaging" (2004).

So, Simon Sai-Man, "Design and Implementation of Calculated Readout by Spectral Parallelism (CRISP) in Magnetic Resonance Imaging (MRI)", Doctoral Dissertation, University of Waterloo (2010).

U.S. Pat. No. 7,688,069, Kraus et al (Los Alamos), Ultra-low-field NMR and MRI to discriminate and identify materials, issued Mar. 30, 2010.

US 2010/0148773, Chen et al (Nat. Taiwan U), Wideband MRI apparatus and method.

US 2009/0278538, Chen et al (Nat Taiwan U), Method and apparatus for simultaneously acquiring multiple slices/slabs in MR system.

U.S. Pat. No. 6,653,833, Baumgartl (Siemens), "Method for sampling a received RF signal, in particular an RF signal from a receiving coil in MRI".

U.S. Pat. No. 7,807,474, Jesmanowicz (Wisconsin) "System and method for direct digitization of NMR signals".

US 2009/0136104, Hajian and Kim, "Noise reduction apparatus, systems, and methods"

SUMMARY OF THE INVENTION

A system and method for radio reception for magnetic resonance imaging is disclosed. According to one embodiment, direct digitization of the radio frequency signal, without frequency shifting, using at least one Josephson junction to generate a series of single-flux-quantum voltage pulses at a rate which is much larger than the frequency of the radio signal, is employed. These pulses are digitally processed to generate a digital representation of the radio frequency signal.

In one embodiment, this receiver can receive a wideband signal that comprises a plurality of narrowband signals such as are conventionally received in known MRI systems. These narrowband signals may be received from a plurality of input antennas, wherein the signals may be subject to analog combination before digitization. Alternatively, digital signals from a plurality of antennas may be digitally multiplexed after direct digitization. This system and method enables several techniques that lead to faster imaging with improved spatial resolution.

According to a preferred embodiment, the RF sensors are superconducting magnetic field sensors, e.g., SQUIDs, and are provided in a spatial array, to therefore provide spatial encoding of magnetic field data. The SQUIDs preferably respond to magnetic fields up to high frequencies. For example, for hydrogen in a 10 T magnetic field, a sensor capable of detecting a 400 MHz signal is required. As a digital sensor, a degree of oversampling is appropriate, e.g., at least 2 times, and preferably at least 4-8 times. For lower magnetic field strength, the characteristic frequency is lower.

One aspect of the system and method therefore provides a radio frequency receiver for Magnetic Resonance Imaging using Single-Flux-Quantum Digital Electronics. This system preferably comprises at least one device that converts a radiofrequency magnetic flux signal to an oversampled digital representation. The device preferably comprises at least one Josephson junction. The oversampled digital representation may comprise a series of single-flux-quantum voltage pulses. An oversampled representation may be reduced in sampling rate to obtain additional bits of precision.

In one embodiment of the invention, the RF magnetic flux digitizer comprises a superconducting analog-to-digital converter (ADC), as described in "Superconducting analog-to-digital converters", O. Mukhanov et al., Proceedings of the IEEE, vol. 92, p. 1564, 2004. For example, this ADC may comprise a phase-modulation-demodulation ADC which is sampled at a clock rate in excess of 1 GHz, and which exhibits a flux-equivalent noise spectral density of less than about 10 $\mu\Phi_0/\sqrt{Hz}$, where $\Phi_0 = h/2e = 2$ fT-m$^2$ is the magnetic flux quantum. Such an ADC demonstrates both the sensitivity and the linear dynamic range needed for digitizing the weak flux signal present in MRI measurements. In the context of this invention, such a superconductor ADC with magnetic flux input provides an example of an integrated digital SQUID.

A traditional MRI system downconverts a narrowband signal from a magnetic coil sensor, producing a baseband signal which is then digitized. On the other hand, one embodiment of the present system employs a large bandwidth high frequency digitizer that operates directly on the radio frequency signal. Further, the sensor is able to detect small perturbations when operating within relatively large magnetic fields, i.e., it exhibits a large dynamic range.

While one embodiment of the system employs an array of sensors, another embodiment employs a more traditional architecture with a single pickup coil, with a wideband detector.

The present technology provides, in accordance with one embodiment, an MRI system which comprises an array of receiver coils, each associated with a SQUID-based magnetic field sensor. In a preferred embodiment, as shown in FIG. 1, there are N receivers, where N may be a large number, for example, 100-1000. All receivers may be mounted together in the same cryostat, for convenience of refrigeration. Each receiver comprises a coupling coil and a SQUID-based transducer and digitizer.

The coupling coil may be a traditional conductive wire coil, or an integrated inductive coil on a common substrate with the SQUID, for example. The coupling coil may comprise a narrowband resonant antenna with capacitance as well as inductance, or alternatively may be a broadband antenna. In some embodiments, the coupling coil may comprise a superconducting material; in others it may comprise a low-resistivity metal such as copper. According to the present superconductor technology, a superconducting coil and SQUID must be cooled to an appropriate cryogenic temperature for proper operation. However, even a resistive coil will generally reduce its resistance and exhibit improved low-noise performance at cryogenic temperatures. In one embodiment, the flux signal from the coupling coil is fed directly to the SQUID. In an alternative embodiment, the flux signal may first be amplified using an appropriate low-noise amplifier (LNA), which may comprise a semiconductor device, and may be cooled to cryogenic temperatures to reduce noise. The output of this LNA would then be coupled to the SQUID.

The digitizer may generate an oversampled representation of the RF signal, which is digitally downconverted and averaged to obtain the baseband (envelope) signal that is used for imaging. The resulting multi-bit digital signal may be serialized and multiplexed with similar signals (e.g., to reduce the number of output lines from the cryostat), then sent to a digital processing module at room temperature.

The SQUIDs may be low temperature superconductors, i.e., operating below 20 K, high temperature superconductors, operating below −70° C. (~200 K), and, as they emerge, room temperature superconductors. Preferably, according to currently available devices, low temperature superconductors are employed. While such cryogenic cooling can be obtained using a liquid cryogen such as liquid nitrogen (T=77 K) or liquid helium (T=4 K), in a preferred embodiment of the invention, the required cooling is obtained using a closed-cycle cryogenic refrigerator known as a cryocooler. Such cryocoolers are available commercially, and can provide reliable cooling with only a source of electrical power provided.

According to a second embodiment, shown in FIG. 2, an external multiplexer controller is used to select the signal from each pickup coil in sequence, with digital processing applied only to the selected signal. This has an advantage in reducing the required digital hardware. More generally, one may design a multiplexed system to reduce the N digital processing chains to any number between 1 and N, depending on an appropriate compromise of system complexity and performance.

A third embodiment is shown in FIG. 3, in which a digital switch matrix is used as a digital multiplexer that functions similarly to that in FIG. 2. These examples illustrate the flexibility of digital processing, which may be carried out using superconducting circuits in a cryostat, or semiconductor circuits at room temperature, or in an optimized combination of the two.

The array of coupling coils may be distributed across an area approximately as shown in FIG. 4. This represents a closely spaced two-dimensional array, located close to the patient or the tissue to be imaged. Alternatively, a linear array of long pickup coils may be used, as shown in FIG. 5.

It is also possible to provide a three dimensional array of detectors, each having a different spatial sensitivity pattern to magnetic fields, in addition to possible sensitivity to different frequencies.

While some parts of the measurement procedure of applied field gradients and pulse excitations will be similar to those in conventional MRI, spatial information in one direction (for the linear array) or in two dimensions (for the area array) will be obtained by digital analysis of the signals from the respective receiver elements, rather than by repeated application of magnetic field gradients. This will dramatically enhance the speed of the image acquisition.

Each SQUID-based detector in the preferred embodiments may comprise a digital SQUID, similar to that disclosed in U.S. Pat. No. 5,420,586, expressly incorporated by reference. In another preferred embodiment, a SQUID-based detector may comprise a superconducting analog-to-digital converter which generates SFQ voltage pulses, similar to that disclosed in U.S. Pat. No. 7,365,663 or U.S. Pat. No. 7,598,897, each of which is incorporated herein by reference. In yet another preferred embodiment, each SQUID-based detector may itself comprise a plurality of SQUIDs, as in a superconducting quantum interference filter (SQIF).

The resonant detection frequency is not limited to low kHz frequencies and ultra-low magnetic fields, as for conventional analog SQUIDs with external flux-locked control loops. For example, consider a magnetic field of 0.2 T, which corresponds to f=8.5 MHz. This field is intermediate between that of conventional high-field MRI and ultra-low-field MRI of the prior art. Such a field can be obtained by either a permanent magnet, conventional electromagnet, or superconducting magnet, or combination thereof as may be appropriate. A field of this magnitude, although too large to be directly exposed to the SQUID electronics, may be shielded by proper design and location of the circuits. The MHz frequency is compatible with digital SQUID electronics.

In general, stronger magnetic fields will yield stronger RF signals and better imaging resolution. However, the digital SQUID detectors should permit a favorable tradeoff between high resolution and avoidance of the largest field magnitudes.

In accordance with an aspect of the technology, the excitation and signal processing need not proceed according to traditional Fourier Transform, rectangular coordinate paradigms. Thus, for example, a number of techniques have been proposed which use different algorithms and transforms to acquire and present the image data. In particular, the use of broadband superconducting digital SQUID sensors, for example, permits analysis of broadband data, and thus relieves a general constraint found in the art that the received data be relatively narrow band, and fill in only a very small portion of the k-space matrix per excitation. See, e.g., Dimitris Mitsouras, Frank J. Rybicki, Alan Edelman, Gary P. Zientara, "Fast Magnetic Resonance Imaging via Adaptive Broadband Encoding of the MR Signal Content", Magnetic Resonance Imaging, 24; 1209-1227, 2006, expressly incorporated herein by reference. Mitsouras et al. propose a wavelet excitation, which may be used in accordance with the present system. More generally, however, after an excitation, a spread spectrum (or optimized spectrum) probe of all or a portion of the k-space may be conducted, yielding a corresponding modulated/encoded spread spectrum output, which must be faithfully acquired for image reconstruction. The probe signal is preferably optimized for signal-to-noise ratio, and desired duration of the scan.

One aspect of the present system is that, in addition to magnetic field encoding of space, the use of a plurality of sensors allows direct spatial encoding of emissions; that is, n emissions aliased at the same frequency can be distinguished by using n sensors, and generally if multiple excitations are conducted with different probe patterns, further ambiguity may be resolved, and noise reduced. Thus, a single excitation pulse can be used to acquire image data from a volume, and repeated excitation used to increase resolution and reduce noise. See also, D. K. Sodickson and W. J. Manning, "Simultaneous Acquisition of Spatial Harmonics (SMASH): Fast Imaging with Radiofrequency Coil Arrays," Magnetic Resonance in Medicine, vol. 38, pp. 591-603, 1997; K. P. Pruessman, M. Weiger, M. B. Scheidegger, and P. Boesiger, "SENSE: Sensitivity Encoding for Fast MRI," Magnetic Resonance in Medicine, vol. 42, pp. 952-962, 1999; W. E. Kyriakos, L. P. Panych, S. F. Kacher, C.-F. Westin, S. M. Bao, R. V. Mulkern, and F. A. Jolesz, "Sensitivity Profiles from an Array of Coils for Encoding and Reconstruction in Parallel (SPACERIP)," Magnetic Resonance in Medicine, vol. 44, pp. 301-308, 2000; Djaudat Idiyatullin, Curt Corum, Jang-Yeon Park, Michael Garwood, "Fast and quiet MRI using a swept radiofrequency", Journal of Magnetic Resonance 181 (2006)

342-349; Wright, S. M. McDougall, M. P. Ke Feng Hollingsworth, N. A. Bosshard, J. C. Chieh-Wei Chang, "Highly Parallel Transmit/Receive Systems for Dynamic MRI", 31st Annual International Conference of the IEEE EMBS, Minneapolis, Minn., USA, Sep. 2-6, 2009, William Scott Hoge, "An Adaptive Signal Processing Approach to Dynamic Magnetic Resonance Imaging", Ph.D. Dissertation, Northeastern University (2001), each of which is expressly incorporated herein by reference.

Another aspect of the technology is the use of non-rectangular coordinate systems, and more particularly the permissive use of non-linear magnetic gradients. In general, linear gradients are required in systems which directly map field strength to position, and therefore that a magnetic field strength distortion leads directly to an image distortion; further, severe distortion leads to aliasing. By using a generic algorithm that does not presume field linearity, and especially with a spatial array of sensors, the requirement of linear magnetic field may be substantially relaxed, to permit, for example, uncompensated magnets or relatively simple configurations of magnets, and permanent magnets. See, for example, David A. Thayer, "Imaging Techniques and Hardware For Inhomogeneous MRI", Master's Degree Thesis, Department of Electrical and Computer Engineering, Brigham Young University (2004), expressly incorporated herein by reference in its entirety.

A further aspect of the technology provides a magnetic polarization-responsive sensor array, which can be used to filter noise, since the noise process has different polarization characteristics from the MRI signal process. This polarization filtering extends the sensor array to extract signal vectors, rather than simple scalar values.

A still further aspect of the technology provides an adaptive imaging technique in which an initial estimate of the image is constructed, which for example may be based on a model of the object to be imaged and prior data obtained during the same session. The model may be derived from extrinsic data sources, such as a description of the anatomy, video observation, X-ray, ultrasound, or other data. As the model is conformed to the MRI data being obtained, ambiguities may be tested by specially designed excitation to distinguish between multiple possible states. Such a model may also be dynamic, and therefore may be synchronized to respiration, cardiac cycles, neuromuscular activity, and the like. Thus, a movement of a patient need not lead to artifacts, if the degrees of freedom of the patient are understood and accounted for. This adaptive system generally requires real-time processing of the data, but using superconducting digital processors, fast traditional semiconductor processors, parallel processing computational arrays, such as graphics processor units (GPUs), such processing can be completed between each excitation cycle, allowing the image to be resolved in real time.

It is therefore an object to provide a magnetic resonance system, comprising at least one SQUID, configured to receive a radio frequency electromagnetic signal, in a circuit configured to produce a pulsatile output having a minimum pulse frequency of at least 1 GHz which is analyzed in a processor with respect to a timebase, to generate a digital signal representing magnetic resonance information.

It is a further object to provide a magnetic resonance method, comprising: receiving a radio frequency electromagnetic signal, in a circuit comprising a SQUID which produces a pulsatile output having a minimum pulse frequency of at least 1 GHz; analyzing the pulsatile output with respect to a timebase in an automated processor; and generating a digital signal representing magnetic resonance information.

The processor may comprise at least one rapid single flux quantum circuit.

The magnetic resonance information may comprise magnetic resonance image information derived from an object-under-examination.

The processor may receive a set of outputs from each of a plurality of SQUIDs, each SQUID responding to a respective radio frequency electromagnetic signal from a respective antenna having a respectively different spatial placement, with respect to the object-under-examination.

The radio frequency electromagnetic signal may be received from a coil in close proximity to an object-under-examination within a magnetic field, and wherein the magnetic resonance image information is presented as spatial data.

The processor may be configured to digitally compensate for an inhomogeneous magnetic field.

The processor may be further configured to define a radio frequency excitation signal for addressing volumetric regions within a magnetic field.

The processor may defines or generate a broadband radio frequency excitation signal for addressing at least one of a spatial range of volumetric regions and a plurality of different magnetically resonant isotopes.

The processor may receive the pulsatile output of the SQUID and decimates in time to produce a signal representation having an update rate less than the pulse frequency of the pulsatile output and a data representation at each update of greater than 1 bit.

A plurality of antennas may be provided, distributed in space, the antennas each feeding a respective one of a plurality of SQUIDs, each SQUID forming part of a circuit configured to produce a pulsatile output having a minimum pulse frequency of at least 1 GHz which is analyzed in the processor with respect to the timebase, to generate a digital signal representing magnetic resonance information from a space proximate to the antennas.

The SQUID may be configured to represent in its pulsatile output a radio frequency magnetic field comprising frequencies of at least 100 kHz, whereby the digital signal is substantially oversampled.

The magnetic resonance information may comprise magnetic resonance image information derived from an object-under-examination, further comprising outputting an image representation of the magnetic resonance image information. The magnetic resonance information may further comprise magnetic resonance spectroscopic information, which may be used to complement the image representation. The object-under-examination may comprise a living human body or portion thereof for medical imaging, or a biomedical object or tissue that is subject to high-resolution or microscopic examination. Alternatively, the object-under-examination may comprise a non-biological object that is under examination for spectroscopic or microstructural analysis.

DETAILED DESCRIPTION OF THE INVENTION

In a conventional MRI system of the prior art, DC magnetic gradient coils produce a magnetic field gradient that is scanned across the object to be imaged. At a given time, only a single volume slice is in resonance with the RF source (and thus excited), and only a single line in K-space is accessed, and the image is developed sequentially. This scanned, sequential nature is what makes the imaging so slow.

Figure 4:
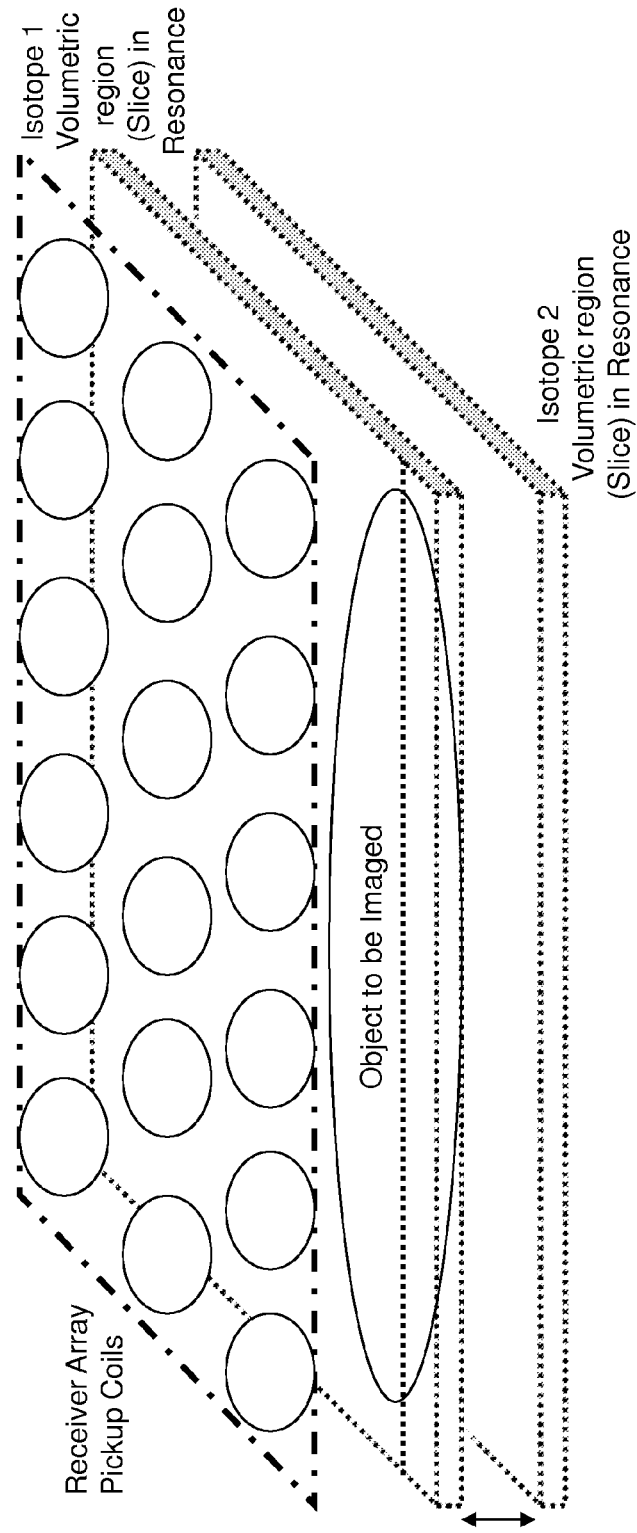
FIG. 4 shows a conceptual picture of a two-dimensional array of pickup coils, lying above the object to be imaged.

In a preferred embodiment of the MRI system, as shown in FIG. 4, each element of the detector array comprises a magnetic pickup coil or antenna, which is designed to selectively detect local electromagnetic fields surrounding the pickup coil, and generally emitted close to the pickup coil. The entire area may be in resonance, so that scanning of a gradient field across this area is not necessary, and each pixel is derived from a given antenna element. The parallel processing of the data from each antenna is what makes the imaging much faster, with a total imaging time that may ultimately approach the pulse relaxation times less than 1 s. This may permit imaging of images moving or changing in time, i.e., video imaging.

It may still be necessary to apply a gradient field in the third dimension, corresponding to selecting a slice parallel to the array, into the depth of the object. In an alternate preferred embodiment of the invention shown in FIG. 5, the detector array may comprise a set of long narrow parallel pickup coils arrayed along a single direction. In that case, one would need a gradient field to excite a line parallel to the array direction (and perpendicular to the coil length) to provide spatial information perpendicular to the array direction. Such a resonant line could be scanned across the object, as well as through its depth. Clearly, imaging using a resonant area would proceed faster than a resonant line, which would be faster than a resonant voxel. In general, the greater parallelism requires a greater number of receiver elements. The balance between speed and system complexity would be determined by the needs of a given application.

In greater detail, each coil may comprise an inductive coil with inductance L (which may have multiple turns), designed to detect the RF magnetic field of the signal emitted by the object. Each coil may also be a resonant coil at the detection frequency, whereby a capacitor C is combined with the inductor corresponding to an LC resonator such that the resonant frequency $f=1/2\pi\sqrt{(LC)}$ is the desired detection frequency. The inductor may comprise a superconducting inductor, which will tend to increase the quality factor Q of the resonator. A higher Q is generally preferable, provided the bandwidth is large enough to measure the entire RF signal; a higher Q receiver would receive less broadband noise.

In a preferred embodiment, a pickup coil may comprise a first-derivative gradiometer or a second-derivative gradiometer, as disclosed, for example, in U.S. Pat. No. 7,002,341, "Superconducting quantum interference apparatus and method for high-resolution imaging of samples", expressly incorporated herein by reference. Such an RF gradiometer coil (which is to be distinguished from the DC gradient field coils) comprises a compound inductor designed to cancel uniform magnetic fields (and uniform field gradients for the second-derivative case). In this way, a gradiometer coil is far more sensitive to signals emitted from sources very close to the coil, rather than sources further away. This permits one to directly obtain spatial resolution from each receiver coil. The spatial resolution from the coils will be used in combination with the resonant volume, area or line to provide imaging in three dimensions.

Note that a gradiometer signal may alternatively be obtained by subtracting signals from adjacent pickup coils further in the data processing. However, gradiometer coupling at the front end should enhance the effective dynamic range of the detectors.

Figure 1:
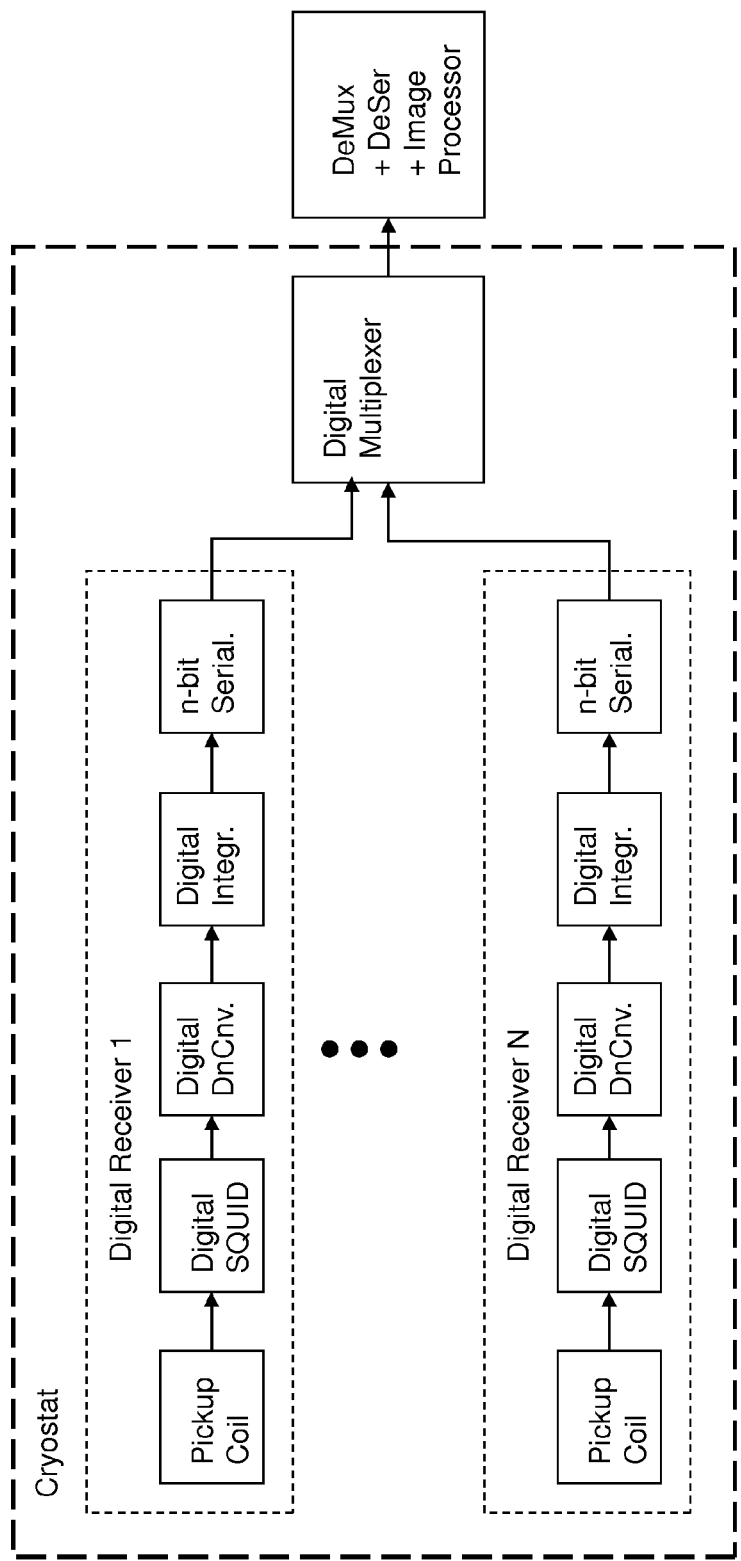
FIG. 1 shows a block diagram of a preferred embodiment of the invention, with N parallel digital SQUID-based receivers.

The data processing chain for each receiver is shown in FIG. 1. The RF signal from the pickup coil is coupled to a digital SQUID, which generates single-flux-quantum (SFQ) digital pulses at a high data rate (typically of order 10 GHz or greater). The RF signal is a narrow-band signal at $f=\gamma B$ (where B is the measurement magnetic field and $\gamma$=43 MHz/T) which may be from the kHz to the MHz range. As described above, a digital SQUID can measure RF fields well into the MHz range, unlike a conventional analog SQUID with an external control loop which is limited to a few kHz. Since the GHz data rate from the SQUIDs is much higher than the MHz magnetic signal to be analyzed, this represents an oversampled digital signal. The higher frequency MHz range may correspond to stronger signals which may provide higher-resolution images.

The required signal for imaging is actually a relaxation time of the RF pulse after excitation, typically of order 0.1-1 s. (There are several distinct relaxation times, referred to in the literature as $T_1$, $T_2$ and $T_2^*$.) One can regard the slow relaxation as a baseband signal that modulates the RF carrier. So it is useful to downconvert the RF signal and extract this baseband signal digitally, using a digital local oscillator. The resulting signal can be digitally averaged using a digital decimation filter (effectively a binary counter) to increase the number of bits and decrease the bandwidth. Some or all of this digital processing may be carried out using superconducting rapid-single-flux-quantum (RSFQ) electronics, which is matched to the output format of the digital SQUID. The digital baseband signal can then be amplified and sent out of the cryostat to interface with conventional semiconductor digital electronics at room temperature for further digital processing and image generation.

While the digital baseband signals from each of the digital receivers could in principle be sent out in parallel, it may be advisable to decrease the number of data lines coming out of the cryostat. A large number of such data lines may conduct heat into the cryostat, which is undesirable. One type of data line reduction is serialization, whereby n bits are sent out sequentially at a higher data rate. In addition, the N signals from the N receivers could be digitally multiplexed. The demultiplexing and deserialization can be carried out using conventional semiconductor digital electronics at room temperature.

Figure 2:
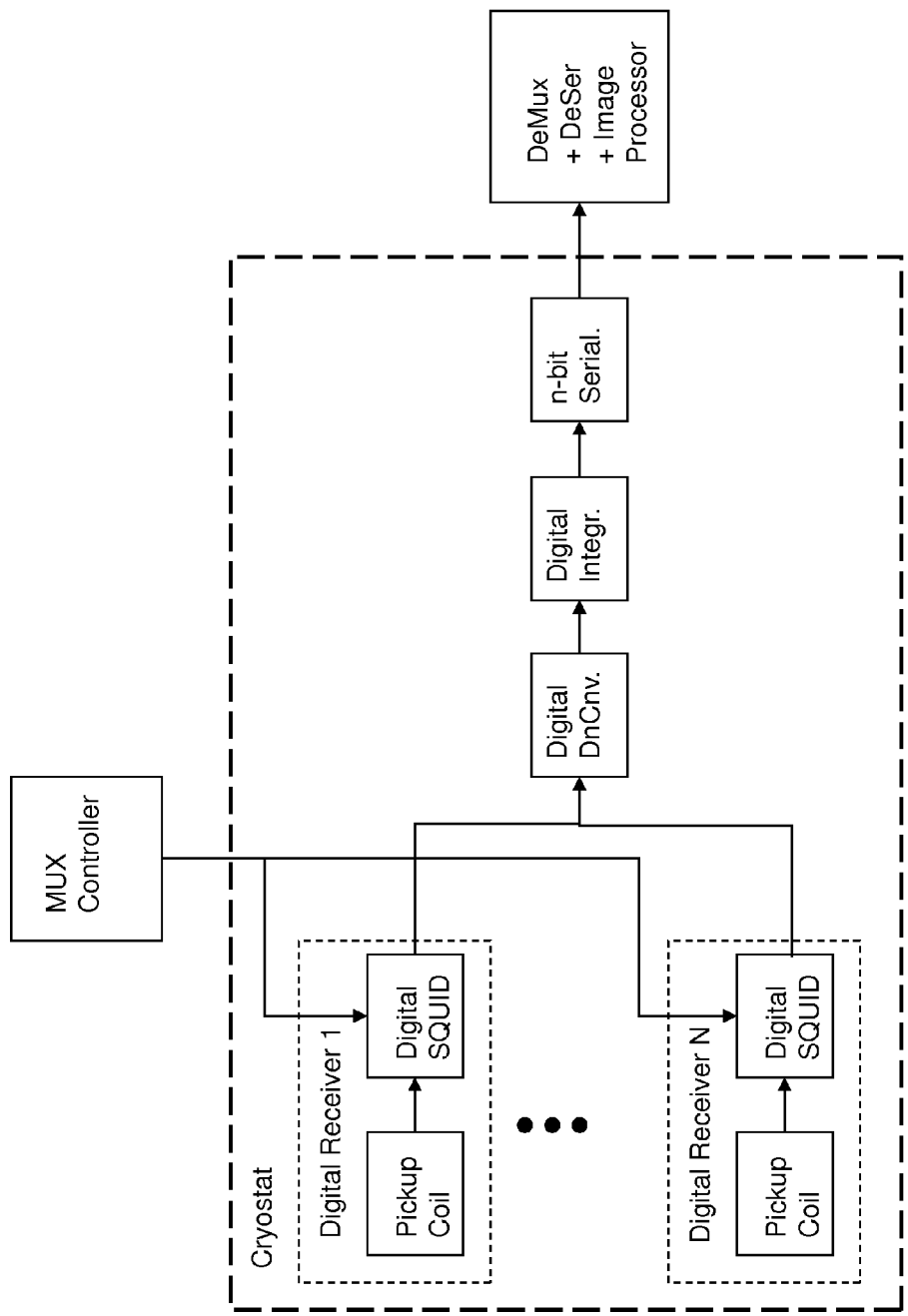
FIG. 2 shows a block diagram of an alternate preferred embodiment of the invention, where the digital SQUIDs are controlled by a multiplexer that feeds the outputs to a single digital processing chain.
Figure 3:
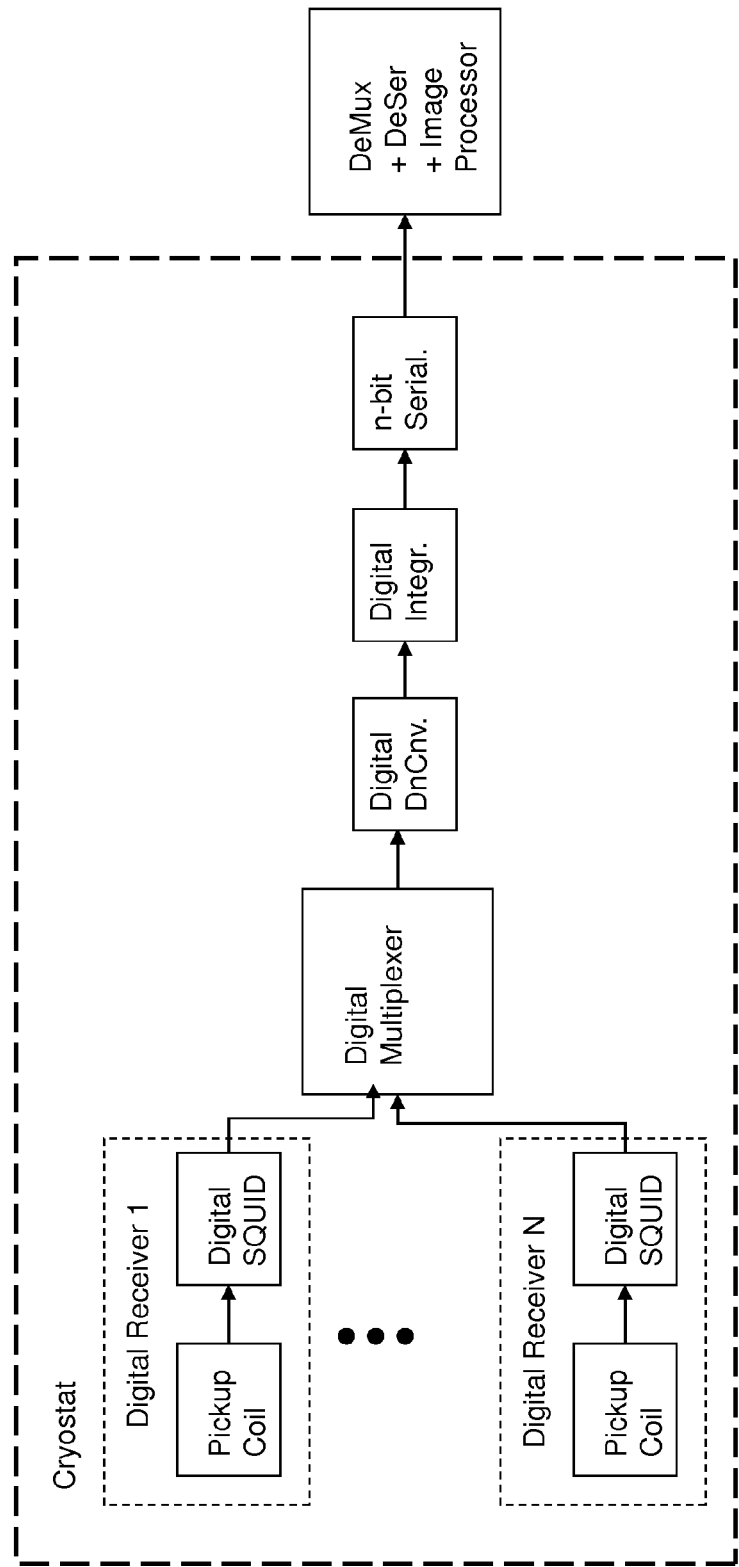
FIG. 3 shows a block diagram of a third preferred embodiment of the invention, where the outputs of the digital SQUIDs are fed to a digital multiplexer for sequential readout.

Two other techniques for digital multiplexing are illustrated in FIGS. 2 and 3. FIG. 2 shows an external multiplexer controller, which may provide external power to activate each of the SQUIDs in sequence. This is similar to the time-domain SQUID multiplexing that has been demonstrated in the prior art for arrays of analog SQUID amplifiers for cryogenic sensor arrays. (See, for example, "Superconducting multiplexer for arrays of transition-edge sensors, J. Chervenak et al., Applied Physics Letters, vol. 74, p. 4043, 1999.) Alternatively, one may use a fully digital multiplexer similar to that in FIG. 1, but one that operates at higher frequencies. (See, for example, "Superconducting digital multiplexers for sensor arrays", A. Kadin et al., Proceedings Thermal Detectors Workshop, NASA, 2003.) Either of these schemes has an advantage in reducing hardware duplication, resulting in a more compact digital processor at cryogenic temperatures, while maintaining the parallel processing with accelerated imaging rate.

Superconducting devices must be cooled to cryogenic temperatures for proper operation. At present, the most widespread digital superconducting electronics technology is comprised of niobium (Nb) Josephson junctions, which can operate below the critical temperature below 9 K, and generally are operated below 5 K. These may be installed in a cryostat, which may be cooled either by liquid helium, or using a multi-stage cryocooler. Alternatively, high-temperature superconductors such as $YBa_2Cu_3O_7$ (YBCO) may be used, with a critical temperature of 90 K. Such a system may operate in liquid nitrogen (at 77 K), or with a single-stage cryocooler at temperatures of 40 K or above. While the reliability and performance of YBCO SQUIDs and digital electronics are currently inferior to that of Nb, the same circuit architectures may be applied if and when these or other higher-temperature materials become practical.

It is necessary to design the pickup coil assembly to lie close to the object to be imaged, without subjecting the object (which may be a human patient) to cold temperatures. This requires that the superconducting devices be properly packaged inside a cryostat with vacuum jacketing. Further, the RF signals must pass through the cryostat walls without loss, so that metallic jackets and shields cannot be used. Such a non-metallic cryostat has been demonstrated in the prior art, using components such as reinforced fiberglass.

It may also be necessary to shield the Digital SQUIDs and superconducting electronics from a large magnetic field that may be used as a polarizing field or a measuring field. While the pickup coils must be near the object to be imaged, and thereby close to the large magnetic field, the superconducting devices can be located inside a magnetic shield, which may be some distance away from the peak magnetic field. Appropriate magnetic shield materials may include superconducting layers as well as soft ferromagnetic materials such as mu-metal. The pickup coils may be spread over a relatively large area, but the superconducting devices may be concentrated on a small number of chips on a multi-chip module located in a central, shielded assembly.

Note that the term "Digital SQUID" in FIGS. 1-3 refers to any superconducting device comprised of Josephson junctions that converts magnetic flux to digital pulses, e.g., SFQ digital voltage pulses. Several such circuits are described in the review article on "Superconducting analog-to-digital converters", O. Mukhanov et al., Proceedings of the IEEE, vol. 92, p. 1564, 2004.

Figure 5:
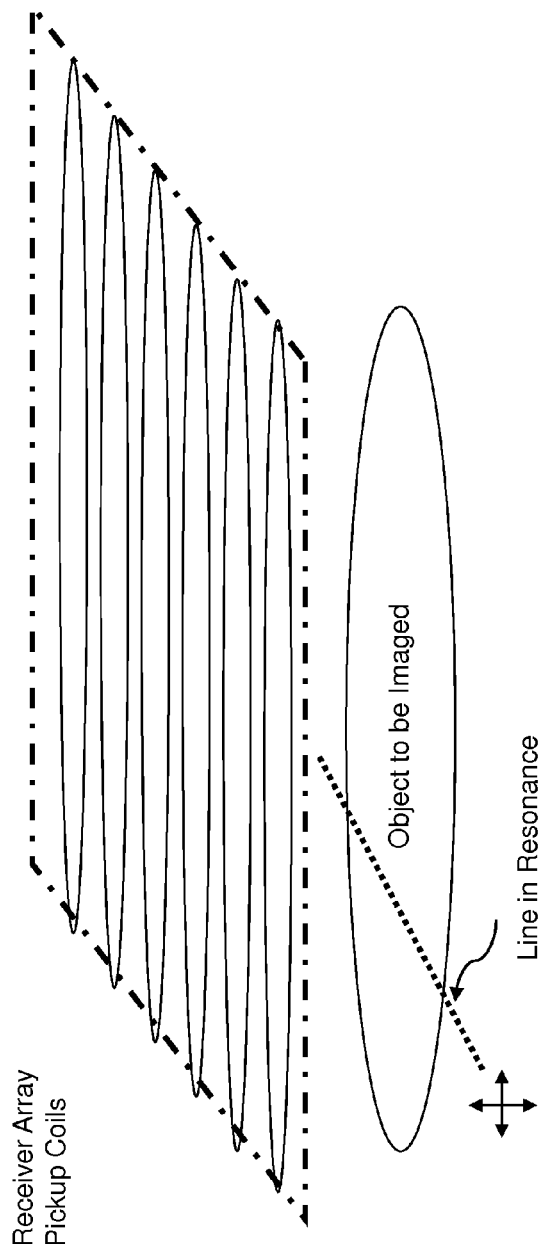
FIG. 5 shows a conceptual picture of a one-dimensional array of pickup coils, lying above the object to be imaged.

In another preferred embodiment, the array of coupling coils as in FIGS. 4 and 5, and analogously, a volumetric array, may be scanned across the object to be imaged (or the array held fixed and the object moved). This would permit imaging of a larger object to high spatial resolution, without requiring a proportionally larger number of array elements. While this scanning would slow down the imaging process, the acceleration permitted by the array parallelism may make this practical.

In yet another preferred embodiment, an additional mode of parallelism may be associated with the RF excitation signal. For example, one may apply a deliberate magnetic field gradient such that one plane is selected to have resonant frequency $f_1$ and another adjacent plane to have resonant frequency $f_2$. If the RF excitation signal (from one or more transmit antennas) simultaneously comprises appropriate pulses with frequencies $f_1$ and $f_2$, then the RF decay signal will comprise components at both frequencies. If both of these frequencies are within the bandwidth of the digital SQUID detector, then both signals will be detected, but can be separated by subsequent digital filtering or other types of analysis. This provides an example of frequency-domain multiplexing, with potential processing speedup proportional to the number of frequencies N selected, which are clearly not limited to two. For a two-dimensional array such as that in FIG. 4, this approach would permit simultaneous selection of N parallel slices in resonance.

The main thrust of this technology is to provide parallel processing to enable fast imaging, at rates that may be faster than pulse rates or breathing rates, or functional MRI with a single stimulus. However, the massively parallel processing may also enable other approaches to MRI that are conventionally too slow. For example, while MRI generally uses the proton signal (from hydrogen in water and organic compounds), other atomic nuclei such as isotopes of Na and P also exhibit magnetic resonance, with a much weaker signal due to the lower concentration of these atoms. Extensive signal averaging or other extended temporal signal processing, would be useful to obtain a high-resolution image, but the speed-up and low-noise detectors provided herein may make this feasible.

Figure 6:
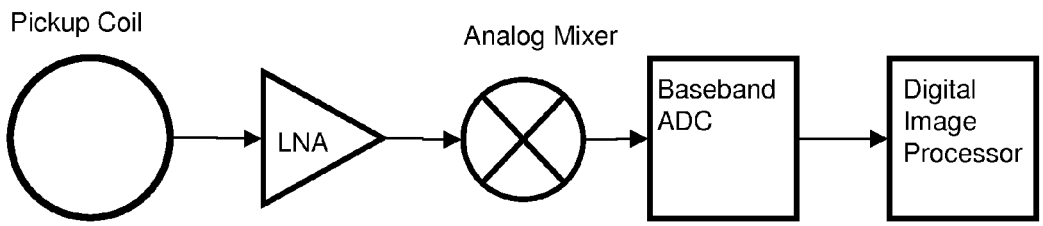
FIG. 6 shows a block diagram of the heterodyne radio receiver for a conventional MRI system.

As described above, MRI is conventionally based on a narrow-band radio communications system, with a narrow-band transmit signal and a narrow-band receive signal, where the frequency is proportional to a value of magnetic field. The bandwidth of the receive signal is typically less than 100 kHz, for a radio signal that may be typically in the range from 40 MHz to 130 MHz. For this reason, a conventional heterodyne receiver is typically used for MRI, as shown in FIG. 6, with an antenna followed by a low-noise amplifier, an analog mixer to downconvert the signal to a lower frequency, and a receiver for the downconverted baseband signal. In modern MRI receivers, a digital baseband receiver is used, with an analog-to-digital converter that operates on the baseband signal, producing a digital signal that can be used to process the image. The sampling rate of this baseband ADC need not be more than about 1 MHz.

Figure 7:
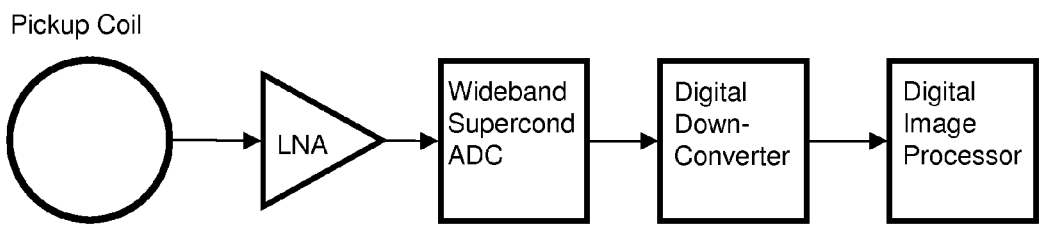
FIG. 7 shows a block diagram for a direct digital radio receiver using a superconducting SQUID digitizer, representing an embodiment of the present invention.

In contrast, in the simplest corresponding system of an embodiment of the technology, shown in FIG. 7, a wideband direct digital RF receiver is used, instead of the heterodyne receiver of FIG. 6. In particular, a wideband superconductor ADC is used, which has a sampling frequency that is in excess of 1 GHz, which may be 20 GHz or higher. For an RF signal at 100 MHz, this is extreme oversampling, which might normally be viewed as unnecessary for this application. Indeed, for a single narrow-band signal, such a receiver is unnecessary and not well matched to the application. However, one can present a direct analogy with a modern multi-user communication system, which increasingly makes use of broadband receivers to simultaneously receive a wide band comprising a plurality of narrow-band signals. If an MRI system is extended to multiple signals that are multiplexed in the frequency, time, and code domains, then a broadband receiver will make more efficient use of the available spectrum with a minimum of hardware. An additional consideration for MRI is that scans are generally quite slow, and parallelizing the component signals in time and/or frequency will enable faster scans.

It is notable that the wideband superconductor ADCs as typically employed herein, are essentially digital SQUIDs, with the sensitivity and low noise that implies. The required gain for the low-noise amplifier may be substantially reduced, or in some cases the LNA may be eliminated entirely, with the pickup coil within the magnetic field, and the SQUID shielded from the high magnetic field but in close proximity, or the SQUID separated from the pickup coil by, e.g., a coaxial cable, with a low noise amplifier (LNA) used to transmit the signal. Conventional MRI receivers typically use this split receiver approach. The coil and LNA may be cooled, for example by a compact 70K cryocooler, to reduce their noise, and a separate 4K cryocooler provided for the low-$T_c$ superconducting circuits in the adjacent instrument room.

Figure 8A:
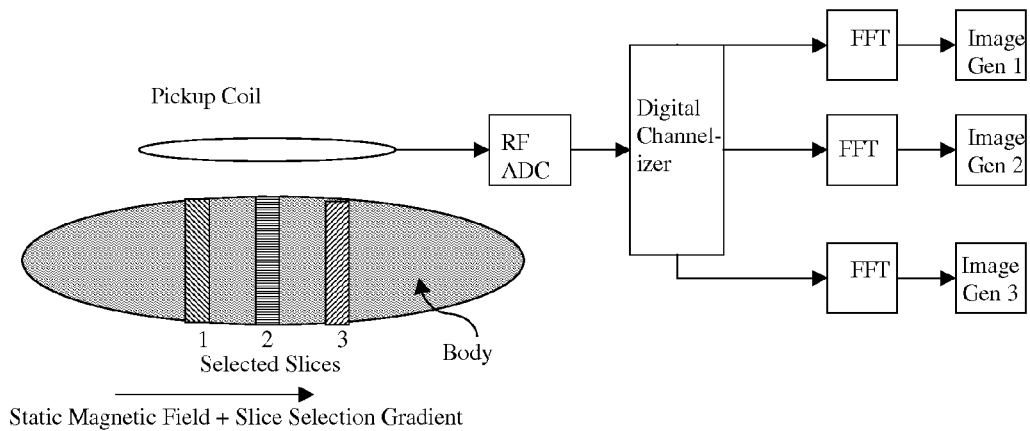
FIG. 8A shows a conceptual diagram of an MRI system according to one embodiment of the present invention, using a single pickup coil but several distinct resonant frequencies.
Figure 8B:
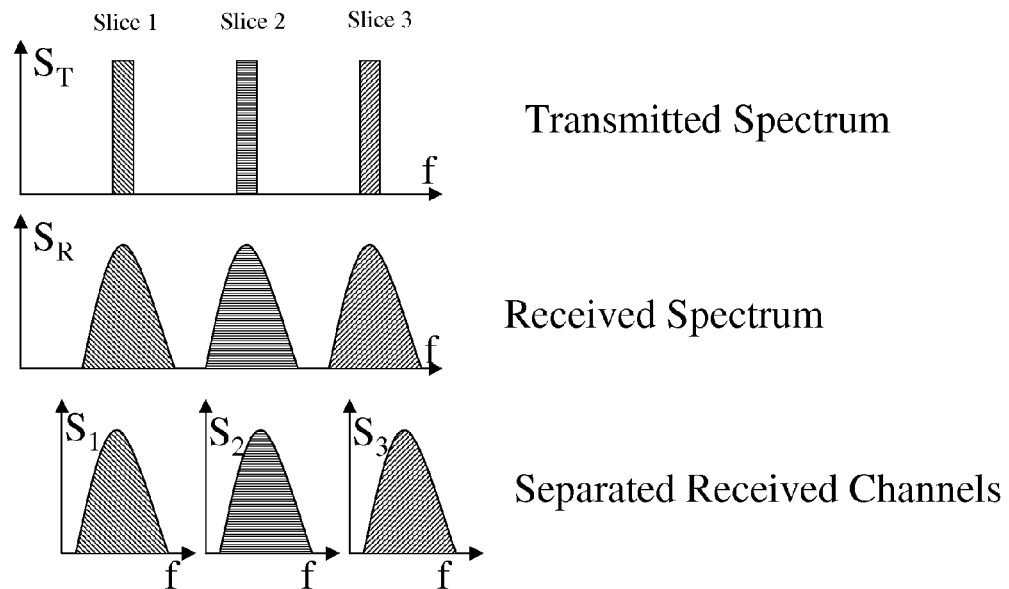
FIG. 8B shows the spectral density of transmitted and received RF signals (and channelized baseband signals) corresponding to the system of FIG. 8A.

In one embodiment, a plurality of radio frequencies are simultaneously excited, corresponding to different slices in the body being examined (FIG. 8A). A single wideband receiver can be used to receive all of these frequencies simultaneously, and they can be separated using a digitally channelizer (FIG. 8B). This parallel processing can lead to some speedup in generation of 3D images. This simultaneous multi-slice approach was described in the prior literature (see, e.g., J. H. Weaver, "Simultaneous multislice acquisition of MR images", Magnetic Resonance in Medicine, vol. 8, pp. 275-284, 1988), expressly incorporated herein by reference, and demonstrated for a small number of frequencies, but not implemented in practice because of the lack of an appropriate broadband receiver. See also, US 2009/0278538, expressly incorporated herein by reference.

In an alternative embodiment, a plurality of pickup coils or antennas may be used. These may be arrayed as surface coils along the surface of the object to be imaged, as shown in FIGS. 4 and 5. These might comprise a 1D array of coils that can be scanned, a 2D array of coils (FIG. 4), or a 1D array of long coils (FIG. 5). In one configuration, each such pickup coil may be connected a separate receiver. While such parallel coil arrays are being implemented using conventional technology, the multiplication of analog RF receivers and processing arrays, each independently calibrated, has problems with scaling to large arrays.

In one embodiment, the hardware for multiple coils is simplified by using direct digital receivers with digital signals that may be multiplexed. For example, FIG. 1 shows an array of broadband direct digital receivers, each based on an oversampled superconducting ADC (also described as a digital SQUID). The narrowband signals are digitally extracted, and digitally combined in time, frequency, or code domains using a high-speed digital multiplexer. Variants of this are shown in FIGS. 2 and 3, where the digital multiplexer is applied to the broadband digital signal earlier in the processing chain. FIG. 2 shows a system which employs time-domain multiplexing of signals with an external controller. FIG. 3 shows a more general multiplexer for combining digital signals.

Figure 9:
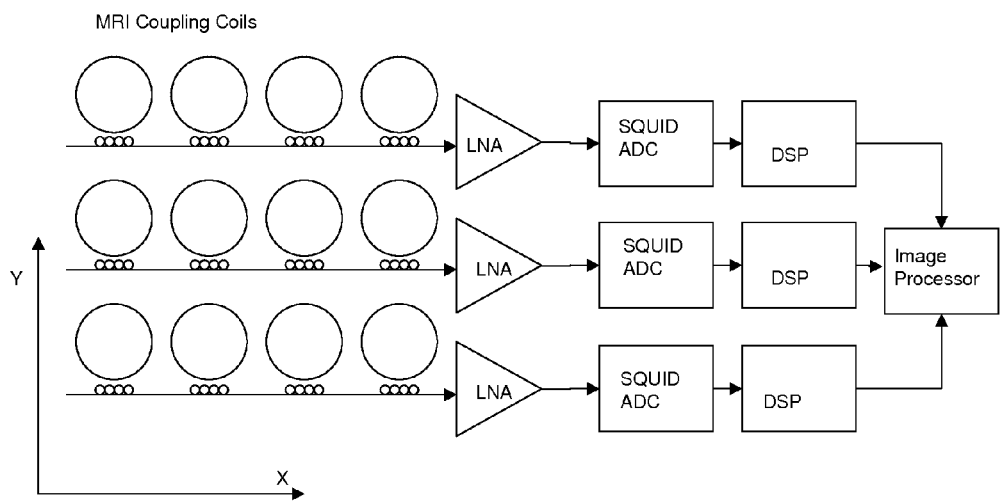
FIG. 9 shows a conceptual block diagram of a two-dimensional MRI antenna array with a linear array of digital receivers.

In another preferred embodiment, one may have a plurality of direct digital receivers, each of which combines the inputs from a plurality of coupling coils. For example, in FIG. 9, the signals from a row of coupling coils (which are assumed to represent signals that are appropriately orthogonal in frequency, time, or code) are combined on the same transmission line that feeds a SQUID ADC (oversampled superconducting ADC). But there are also multiple rows. Together, these enable spatial information in 2 dimensions. These can be combined with conventional resonant excitation from a transmit signal to obtain spatial resolution in the z-direction.

In principle, the superconductor MRI system could apply to systems with either large magnetic fields or small magnetic fields, with frequencies from 1 MHz to 500 MHz or more. Large fields provide larger signals, higher signal to noise ratio, and that is the direction that the technology is moving. But large fields are expensive and heavy, and create problems with RF heating, acoustic noise, and issues of safety and imaging artifacts. If one could obtain the same imaging speed and resolution with a 0.5 T system as with a 1.5 T system, the lower field would be preferred. The superconductor digital-SQUID receivers should be more sensitive than conventional receivers, particularly for relatively low frequencies, permitting operation in different regimes than traditional sensors.

The embodiments presented here are not exclusive, but are used to illustrate the wide range of flexible digital processing solutions that are enabled by the use of broadband digital receivers.

There has thus been shown and described detector methods and systems for magnetic resonance imaging which fulfill all the objects and advantages sought therefor. Many changes, modifications, variations, combinations, subcombinations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. A magnetic resonance imaging system, comprising a plurality of SQUIDs, each being configured to receive a radio frequency electromagnetic signal, and provided within a circuit configured to produce a pulsatile output having a minimum pulse frequency of at least 1 GHz which is analyzed in a digital processor with respect to a timebase, to generate a digital signal representing magnetic resonance image information derived from an object under examination, wherein the processor receives a set of outputs from each of a plurality of SQUIDs, each respective SQUID responds to a respective antenna having a respectively different spatial placement, with respect to the object-under-examination.

2. The magnetic resonance imaging system according to claim 1, wherein the digital processor comprises at least one rapid single flux quantum circuit.

3. The magnetic resonance imaging system according to claim 1, wherein the radio frequency electromagnetic signal is received from a coil in close proximity to an object-under-examination within a magnetic field, and wherein the magnetic resonance image information is presented as spatial data.

4. The magnetic resonance imaging system according to claim 1, wherein the digital processor is configured to digitally compensate for an inhomogeneous magnetic field.

5. The magnetic resonance imaging system according to claim 1, wherein the digital processor is further configured to define a radio frequency excitation signal for addressing volumetric regions within a magnetic field.

6. The magnetic resonance imaging system according to claim 1, wherein the digital processor defines a broadband radio frequency excitation signal for addressing at least one of a spatial range of volumetric regions and a plurality of different magnetically resonant isotopes.

7. The magnetic resonance imaging system according to claim 1, wherein the digital processor receives the pulsatile output of the plurality of SQUIDs and decimates in time to produce a signal representation of each respective pulsatile output having an update rate less than the pulse frequency of the respective pulsatile output and a data representation at each update of greater than 1 bit.

8. A magnetic resonance digital system, comprising:
at plurality of SQUIDs, each being configured to receive a radio frequency electromagnetic signal, and being provided in a respective circuit configured to produce a pulsatile output having a minimum pulse frequency of at least 1 GHz which is analyzed in a digital processor with respect to a timebase, to generate a respective digital signal representing magnetic resonance information; with respect to an object-under-examination; and
a plurality of antennas, distributed in space, the antennas each feeding a respective one of the plurality of SQUIDs, each respective digital signal representing magnetic resonance information from a space proximate to a respective antenna.

9. The magnetic resonance imaging system according to claim 1, wherein each of the plurality of SQUIDs is configured to represent in its pulsatile output a radio frequency magnetic field comprising frequencies of at least 100 kHz.

10. The magnetic resonance imaging system according to claim 1, wherein signals from a plurality of antennas are multiplexed and presented to a common SQUID.

11. The magnetic resonance imaging system according to claim 1, wherein signals from the plurality of SQUIDs are multiplexed into a composite digital signal, presented for analysis by the digital processor.

12. A magnetic resonance digital method, comprising:
providing a plurality of SQUIDs, each SQUID responding to a radio frequency electromagnetic signal from a respective antenna having a respectively different spatial placement, with respect to an object-under-examination, and being disposed in a circuit which produces a pulsatile output having a minimum pulse frequency of at least 1 GHz;
analyzing the pulsatile output of each respective SQUID with respect to a timebase in an automated digital processor; and
generating a digital signal representing magnetic resonance image information derived from the object under examination,
wherein the automated digital processor receives a set of outputs from each of a plurality of SQUIDs.

13. The magnetic resonance digital method according to claim 12, wherein the automated digital processor comprises at least one rapid single flux quantum circuit.

14. The magnetic resonance digital method according to claim 12, further comprising outputting an image representation of the magnetic resonance image information.

15. The magnetic resonance digital method according to claim 12, wherein the analyzing further comprising digitally compensating for an inhomogeneous magnetic field.

16. The magnetic resonance digital method according to claim 12, wherein the generating further comprising generating a radio frequency excitation signal for addressing volumetric regions within a magnetic field.

17. The magnetic resonance imaging method according to claim 12, wherein the generating further comprising generating a broadband radio frequency excitation signal.

18. The magnetic resonance imaging method according to claim 12, wherein the generating further comprising decimating in time to produce a signal representation having an update rate less than the pulse frequency of the pulsatile output and a data representation at each update of greater than 1 bit.

19. The magnetic resonance imaging method according to claim 12, wherein the SQUID is configured to represent in its pulsatile output a radio frequency magnetic field comprising frequencies of at least 100 kHz.

20. A magnetic resonance imaging method, comprising:
receiving a radio frequency electromagnetic signal, in a circuit comprising a plurality of SQUIDs, each of which produces a pulsatile output having a minimum pulse frequency of at least 1 GHz;
analyzing the pulsatile output of each respective SQUID with respect to a timebase in an automated digital processor;
generating a digital signal representing magnetic resonance image information; and
providing a plurality of antennas, distributed in space to receive signals from an object-under-examination, the antennas each feeding a respective one of the plurality of SQUIDs, each SQUID forming part of a circuit configured to produce the pulsatile output having a minimum pulse frequency of at least 1 GHz which is analyzed in the automated digital processor with respect to the timebase, to generate a digital signal representing magnetic resonance information from a space proximate to the antennas.

* * * * *